Jan. 16, 1962 G. F. BATES ETAL 3,017,549
CIRCUIT ELEMENT MOUNTING
Filed April 15, 1960 2 Sheets-Sheet 1

INVENTORS
GRAYSON F. BATES
BY LOUIS W. DESIMONE
F. L. Sullivan
ATTORNEY

INVENTOR.
GRAYSON F. BATES
BY LOUIS W. DESIMONE
F I Sullivan
ATTORNEY

3,017,549
CIRCUIT ELEMENT MOUNTING

Grayson F. Bates, Maynard, and Louis W. De Simone, Needham, Mass., assignors to Sylvania Electric Products Inc., a corporation of Delaware Filed Apr. 15, 1960, Ser. No. 22,427
4 Claims. (Cl. 317—234)

This invention is concerned with electronic circuit elements and in particular with the mounting of elements such as transistors on circuit boards and the protection of circuit element lead wires.

Frequently transistor leads are electrically short circuited by contact between leads or by contact between an individual lead and the casing of the transistor. Damage occurs also if excessive moisture collects at the lead end of the transistor. Consequently, measures must be taken to protect transistor leads in the area of their junction with the transistor casing.

A customary method of accomplishing this purpose has been to immobilize the leads with a plastic potting compound. Another method has been to cover the leads with insulating sleeving. Potting, however, frequently results in damage to the transistors due to heat dissipation from the potting compound used and the high temperature curing necessary, and identification markings of transistors have sometimes been obliterated by the solvents used in the potting process. Disadvantages have also been encountered with insulating sleeving. Among these is the requirement that sleeving be precision cut to fit closely to the transistor casing. The sleeve, to be effective, must have one end forced under the lip of the transistor case, and the leads must be pulled tight during the sleeving process so that both ends of the sleeving will bear tightly against the terminals to which the leads are attached. Failure to use complete precision has resulted in lead-to-lead and lead-to-case contact and shorting. Moisture pocket formation has also been a danger in the sleeving method because of the lack of air flow caused by tight fitting at the lead end of the transistor casing. Moreover, in both methods which have been described there is a tendency for the lead wires, as a result of the motion involved in the process of circuit wiring and adjustment, to bend at the transistor seal. Since these wires are brittle in this area as a result of the manufacturing process used, they frequently break.

Accordingly, a primary object of the present invention is to provide a transistor mounting which protects the transistor from short circuit, moisture, and other damage. A more specific object is to provide a transistor mounting that does not require a formation process which could damage the transistor or its associated accessories. A still further specific object is to provide a mounting technique which prevents twisting of transistor leads. A general objective is to provide an improved mounting for electronic circuit elements.

These and related objects are accomplished in one embodiment of the invention, which will be described as employed in a device for supporting the leads from side mounted transistors. Features of this device include a transistor positioning counterbore, air flow holes connecting an air flow chamber with the atmosphere, a tombstone shape to prevent lead twisting motion, and holes for receiving and separating the transistor leads.

Other objects and features of the invention will be apparent from the following more detailed description of this illustrative embodiment and reference to the accompanying drawings, wherein.

Figure 3:
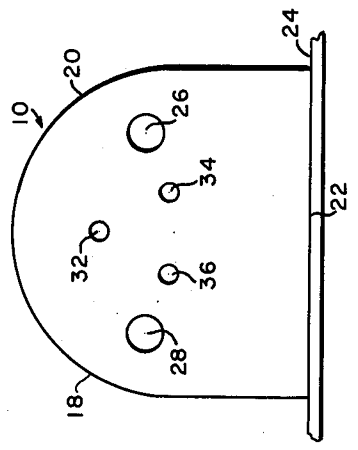
FIG. 3 is a rear view of the support.
Figure 2:
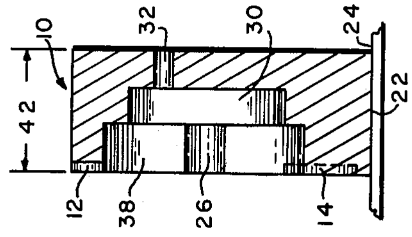
FIG. 2 is a side section along the line 2—2 of FIG. 1.
Figure 1:
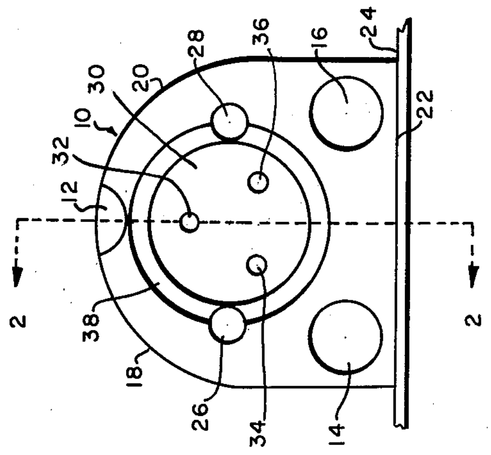
FIG. 1 is a front view of the lead support.

In FIGS. 1, 2, and 3 a transistor-lead-supporting member is shown with die-locating indentations 12, 14, and 16. The member 10 has a tombstone shape with round upper surfaces 18 and 20 and a flat bottom 22, which is adapted to rest upon a printed-circuit board 24 or the like. The front and associated views in FIGS. 1, 2, and 3 also show air holes 26 and 28, an air flow space 30, lead holes 32, 34, and 36, and a counterbore 38 for reception of the lead end of a conventional side-mounted transistor casing. The combination of air space 30 and counterbore 38 may be described as a shouldered cavity.

The supporting member 10 may be made of any insulating substance suitable for molded applications, but a preferred material is an insulating plastic having the chemical designation of diallyl phthalate, which is preferable for this type of close tolerance work because of its fibre length, heat resistance, strength, and shape-retention characteristics. Air flow holes 26 and 28 provide means by which atmospheric air may be circulated to and from the air chamber 30, so that air collecting at the lead end of the transistor casing does not become stagnant and, through condensation, produce moisture with a consequent danger of short circuiting the transistor leads.

Counterbore 38 provides a means for holding the transistor casing lip so that the common center of lead holes 32, 34 and 36 will be properly positioned for the holes to accommodate the transistor leads.

Lead holes 32, 34, and 36 hold the transistor leads apart to prevent short circuiting between leads or between any lead and the transistor casing.

Figure 4:
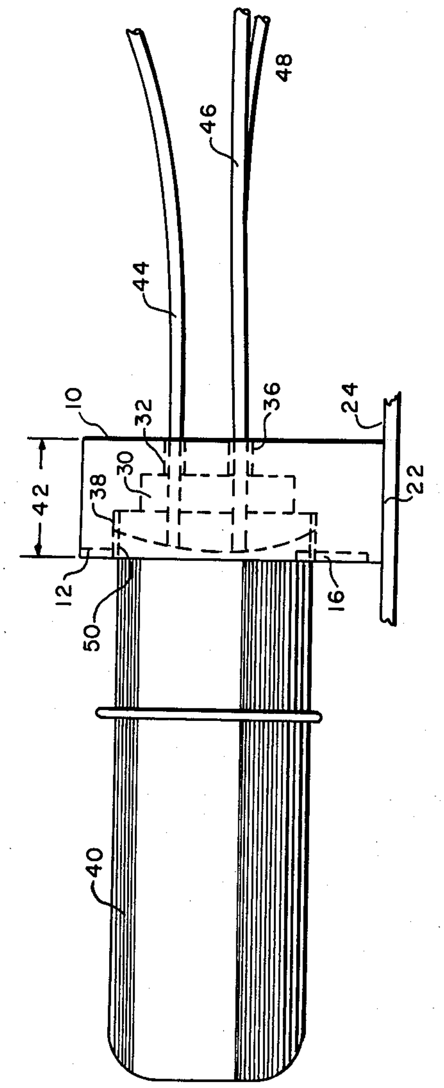
FIG. 4 is a side view of the support and its association with a typical transistor contained in a side-mounted casing.

FIG. 4 shows a mating of the transistor casing 40 to the lead supporting member 10. Air holes 26 and 28 (see FIGS. 1 and 3) go through the breadth 42 of the transistor mounting 10 and are intersected near the center of the breadth 42 by an air chamber 30. This promotes the flow of air and prevents moisture pockets from forming at the base of the transistor. The transistor casing is generally fastened to, and the lead supporting device rests upon, a printed-circuit board 24 or other suitable component surface on its flat side 22 to insure stability and prevent twisting of the leads 44, 46, and 48 which might result from rotation of the mounting 10. The counterbore 38 provides a close fit and helps position the lip 50 of the transistor casing 40. Moreover, the lead support 10 acts like an insulating washer and prevents the leads from flexing in their brittle area at the base of the transistor.

The invention has been described as employed in combination with a side-mounted transistor for protection of the transistor and associated apparatus from the danger of short circuiting. It is not, however, limited to the specific shape, structure, design or combination shown and described, but is to be accorded the full scope of the following claims.

What is claimed is:

1. For an electronic circuit element having a base surface and a plurality of lead wires projecting therefrom, a lead wire supporting device comprising: a member having an open-faced cavity adapted to fit against said base, a cavity wall opposite the open face of said cavity, a first plurality of holes in said wall to accommodate the passage of said leads from said base through said cavity, and a second plurality of holes in said member to provide for air flow between said cavity and the outside atmosphere.

2. For a circuit element having a plurality of lead wires projecting from a base surface, a lead wire supporting device comprising: a support member having an air flow cavity; a first set of holes in said member to accommodate the passage of lead wires through said cavity; and, a second set of holes in said member to provide passages for circulation of the surrounding atmosphere through said cavity.

3. In an electronic circuit mounted upon a supporting surface, the combination of: a circuit element secured to said supporting surface, said element having an outer casing, a base surface, a lip on said casing surrounding said base surface and a plurality of lead wires projecting from said base surface; and, a device for supporting said lead wires, said device having a shouldered air flow cavity, counterbore means holding said casing lip above the shoulder of said cavity, a first plurality of holes accommodating the passage of said lead wires through said cavity, a second plurality of holes providing passages for air flow through said cavity, and a substantially flat surface in engagement with said supporting surface to prevent relative rotation of said lead wires and said circuit element.

4. In an electronic circuit mounted upon a supporting surface, the combination of: a transistor secured to said supporting surface, said transistor having an outer casing, a substantially concave base surface, a lip on said casing surrounding said base surface and a plurality of wire leads projecting from said base surface; and, a device for supporting said lead wires, said device having a shouldered air flow cavity, counterbore means holding said casing lip above the shoulder of said cavity, a first plurality of holes accommodating the passage of said lead wires through said cavity, and a substantially flat surface in engagement with said circuit supporting surface to prevent relative rotation of said lead wires and said transistor.

References Cited in the file of this patent

UNITED STATES PATENTS

| | | |
|---|---|---|
| 2,820,929 | Coy | Jan. 21, 1958 |
| 2,820,930 | Coy | Jan. 21, 1958 |